United States Patent
Solaro et al.

(10) Patent No.: US 10,453,836 B2
(45) Date of Patent: Oct. 22, 2019

(54) HIGH HOLDING HIGH VOLTAGE (HHHV) FET FOR ESD PROTECTION WITH MODIFIED SOURCE AND METHOD FOR PRODUCING THE SAME

(71) Applicant: GLOBALFOUNDRIES Singapore Pte. Ltd., Singapore (SG)

(72) Inventors: Yohann Frederic Michel Solaro, Singapore (SG); Vvss Satyasuresh Choppalli, Singapore (SG); Chai Ean Gill, Singapore (SG)

(73) Assignee: GLOBALFOUNDRIES SINGAPORE PTE. LTD., Singapore (SG)

(*) Notice: Subject to any disclaimer, the term of this patent is extended or adjusted under 35 U.S.C. 154(b) by 65 days.

(21) Appl. No.: 15/679,929

(22) Filed: Aug. 17, 2017

(65) Prior Publication Data
US 2019/0057961 A1 Feb. 21, 2019

(51) Int. Cl.
*H01L 27/02* (2006.01)
*H01L 29/06* (2006.01)
(Continued)

(52) U.S. Cl.
CPC ........ *H01L 27/0266* (2013.01); *H01L 27/027* (2013.01); *H01L 29/0615* (2013.01);
(Continued)

(58) Field of Classification Search
CPC ............. H01L 29/7816; H01L 29/6659; H01L 29/1095; H01L 29/0649; H01L 29/0615; H01L 27/0266; H01L 29/66681
See application file for complete search history.

(56) References Cited

U.S. PATENT DOCUMENTS 6,353,247 B1* 3/2002 Pan ............... H01L 27/0266
257/173
6,366,402 B1* 4/2002 Li ................. G02B 5/3083
359/484.05
(Continued)

FOREIGN PATENT DOCUMENTS

CN 103730462 A 4/2014
CN 203659860 U 6/2014

OTHER PUBLICATIONS

Office Action for the related Taiwanese patent application No. 106135071, dated May 9, 2018, 6 pages.

*Primary Examiner* — Allen L Parker
*Assistant Examiner* — Charles N Ausar-El
(74) *Attorney, Agent, or Firm* — Ditthavong & Steiner, P.C.

(57) ABSTRACT

A method of forming a LDMOS with a self-aligned P+ implant and LVPW region at the source side and the resulting device are provided. Embodiments include forming a DNWELL in a p-sub; forming a PWHV in the DNWELL; forming an NW in the DNWELL; forming a LVPW in the PWHV; forming STI structures through the LVPW and through the DNWELL and NW, respectively; forming a gate over the PWHV; forming a first and a second P+ implant in the LVPW, an edge of the second P+ implant aligned with an edge of the gate; forming a first N+ implant in the LVPW between the first STI structure and the second P+ implant and a second N+ in the NW adjacent to the second STI structure; and forming contacts over the first and second P+ and N+ implants, respectively, and an electrical contact over the second N+ implant.

10 Claims, 3 Drawing Sheets

(51) Int. Cl.
  *H01L 29/10*     (2006.01)
  *H01L 29/66*     (2006.01)
  *H01L 29/78*     (2006.01)

(52) U.S. Cl.
  CPC ...... *H01L 29/0649* (2013.01); *H01L 29/1095* (2013.01); *H01L 29/6659* (2013.01); *H01L 29/66681* (2013.01); *H01L 29/7816* (2013.01)

(56) References Cited

U.S. PATENT DOCUMENTS

| | | | |
|---|---|---|---|
| 7,639,464 B1 * | 12/2009 | Vashchenko | H01L 27/0266 361/56 |
| 7,786,507 B2 * | 8/2010 | Denison | H01L 29/7436 257/173 |
| 7,838,937 B1 | 11/2010 | Walker et al. | |
| 7,943,461 B2 * | 5/2011 | Jang | H01L 21/823814 257/E21.63 |
| 8,088,656 B2 * | 1/2012 | Voldman | H01L 29/66659 257/E21.35 |
| 8,222,130 B2 * | 7/2012 | Zhang | H01L 27/0922 438/551 |
| 8,288,235 B2 * | 10/2012 | Verma | H01L 21/743 257/E21.409 |
| 8,847,318 B2 * | 9/2014 | Lai | H01L 27/027 257/355 |
| 9,583,603 B2 * | 2/2017 | Zhan | H01L 29/66325 |
| 9,627,528 B2 * | 4/2017 | Chien | H01L 29/7816 |
| 9,653,459 B2 * | 5/2017 | Chou | H01L 27/088 |
| 9,666,700 B2 * | 5/2017 | Hebert | H01L 29/732 |
| 9,673,084 B2 * | 6/2017 | Liu | H01L 21/76229 |
| 9,679,888 B1 * | 6/2017 | Lee | H01L 27/0266 |
| 9,837,323 B2 * | 12/2017 | Tai | H01L 27/0928 |
| 10,290,631 B2 * | 5/2019 | Moen | H01L 21/76229 |
| 2002/0060345 A1 * | 5/2002 | Yu | H01L 27/0262 257/371 |
| 2003/0197225 A1 * | 10/2003 | Chen | H01L 27/0266 257/355 |
| 2004/0251492 A1 * | 12/2004 | Lin | H01L 29/66689 257/335 |
| 2005/0212050 A1 * | 9/2005 | Kim | H01L 27/0266 257/355 |
| 2008/0017948 A1 * | 1/2008 | Huang | H01L 29/1083 257/487 |
| 2009/0140372 A1 * | 6/2009 | Hodel | H01L 21/823828 257/500 |
| 2010/0019341 A1 * | 1/2010 | Gill | H01L 27/0259 257/487 |
| 2012/0061761 A1 * | 3/2012 | Makiyama | H01L 21/823814 257/355 |
| 2013/0187218 A1 * | 7/2013 | Lai | H01L 27/0328 257/328 |
| 2014/0210007 A1 * | 7/2014 | Deval | H01L 29/7393 257/350 |
| 2014/0264556 A1 * | 9/2014 | Lai | H01L 29/78 257/328 |
| 2014/0353799 A1 * | 12/2014 | Hwang | H01L 29/732 257/577 |
| 2014/0367783 A1 * | 12/2014 | Hwang | H01L 27/0259 257/360 |
| 2016/0149033 A1 * | 5/2016 | Ito | H01L 29/7823 257/339 |
| 2016/0155795 A1 * | 6/2016 | Feng | H01L 29/1095 257/337 |
| 2016/0260700 A1 * | 9/2016 | Huang | H01L 27/0255 |
| 2018/0145066 A1 * | 5/2018 | Lee | H01L 23/5286 |

* cited by examiner

HIGH HOLDING HIGH VOLTAGE (HHHV) FET FOR ESD PROTECTION WITH MODIFIED SOURCE AND METHOD FOR PRODUCING THE SAME

TECHNICAL FIELD

The present disclosure relates to electrostatic discharge (ESD) protection devices. The present disclosure is particularly applicable to a high holding high voltage (HHHV) field-effect transistor (FET).

BACKGROUND

ESD impact on production yield and product quality is increasingly becoming more significant due to requirements for higher speeds and device scaling. In general, ESD protection devices work by providing a path through the integrated circuit (IC) that has high current shunting capabilities. High holding voltage ($V_H$) enables latch-up safe operation of such devices. However, known high voltage (HV) gate-grounded N-channel metal oxide semiconductor (GGNMOS) clamps exhibit low $V_H$, e.g., below drain voltage ($V_{DD}$). In addition, known solutions fail to provide designers with the ability to efficiently control/scale $V_H$ without comprising the device area.

A need therefore exists for methodology enabling formation of an ESD device that exhibits high $V_H$ and enables efficient control of $V_{t1}$ and $V_H$ without compromising the device area and the resulting device.

SUMMARY

An aspect of the present disclosure is a process of forming a laterally diffused metal oxide semiconductor (LDMOS) with an additional self-aligned p-type (P+) implant and a second body well (low-voltage p-well (LVPW)) region at the source side of the device.

Another aspect of the present disclosure is a LDMOS with an additional self-aligned P+ implant and a LVPW region at the source side of the device.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming an n-doped well (DNWELL) region in a portion of a p-type substrate (p-sub); forming a high voltage p-well (PWHV) region in a portion of the DNWELL region; forming an n-well (NW) laterally separated from the PWHV region in a portion of the DNWELL region; forming a LVPW region in a portion of the PWHV region; forming a first and a second shallow trench isolation (STI) structure through a portion of the LVPW region and through a portion of the DNWELL region and NW, respectively; forming a gate over the PWHV region; forming a first and a second P+ implant laterally separated in a portion of the LVPW region, an edge of the second P+ implant aligned with an edge of the gate; forming a first n-type (N+) implant in the LVPW region between and adjacent to the first STI structure and the second P+ implant and a second N+ in the NW adjacent to the second STI structure; and forming a first and a second contact over the first and second P+ and N+ implants, respectively, and an electrical contact over the second N+ implant.

Aspects of the present disclosure include forming the LVPW region with an edge extended a distance past an edge of the second P+ implant and under a portion of the gate. Other aspects include the distance being 0.3 micrometer (μm) to 1.5 μm. Further aspects include forming the LVPW region with an edge terminated a distance before an edge of the second P+ implant closest to the gate. Another aspect includes the distance being 0.1 μm to 0.3 μm. Additional aspects include forming a contact over each of the first and second N+ and P+ implants, respectively; and forming an electrical contact over the second N+ implant. Other aspects include forming first, second, and third STI structures laterally separated through a portion of the p-sub, the p-sub and DNWELL region, and the DNWELL, PWHV, and LVPW regions, respectively, wherein an edge of the third STI structure is adjacent to the first P+ implant; forming a P+ implant in a portion of the p-sub between and adjacent to the first and second STI structures; forming an N+ implant in a portion of the DNWELL region between and adjacent to the second and third STI structures; and forming a fourth STI structure through a portion of the p-sub and DNWELL region and adjacent to the NW and second N+ implant. Further aspects include forming a contact over each of the P+ and N+ implants. Additional aspects include forming a gate dielectric layer over respective portions of the PWHV and DNWELL regions prior to the forming of the gate.

Another aspect of the present disclosure is a device including: a DNWELL region in a portion of a p-sub; a PWHV region in a portion of the DNWELL region; an NW laterally separated from the PWHV region in a portion of the DNWELL region; a LVPW region in a portion of the PWHV region; a first and a second P+ implant laterally separated and a first N+ implant between the first and second P+ implants in a portion of the LVPW region; a second N+ implant in a portion of the NW; a first STI structure through a portion of the LVPW region between and adjacent to the first P+ implant and the first N+ implant; a second STI structure through a portion of the DNWELL region and NW; and a gate over the PWHV region having an edge aligned with an edge of the second P+ implant.

Aspects of the device include an edge of the LVPW region extending a distance past an edge of the second P+ implant and being under a portion of the gate. Other aspects include the distance being 0.3 μm to 1.5 μm. Further aspects include an edge of the LVPW region terminating a distance before an edge of the second P+ implant closest to the gate. Additional aspects include the distance being 0.1 μm to 0.3 μm. Another aspect includes a contact over each of the first and second N+ and P+ implants, respectively; and an electrical contact over the second N+ implant. Other aspects include first, second, and third STI structures laterally separated through a portion of the p-sub, the p-sub and DNWELL region, and the DNWELL, PWHV, and LVPW regions, respectively, wherein an edge of the third STI structure is adjacent to the first P+ implant; a P+ implant in a portion of the p-sub between and adjacent to the first and second STI structures; an N+ implant in a portion of the DNWELL region between and adjacent to the second and third STI structures; and a fourth STI structure through a portion of the p-sub and DNWELL region and adjacent to the NW and second N+ implant. Further aspects include a contact over each of the P+ and N+ implants. Another aspect includes a gate dielectric layer between the PWHV and DNWELL regions and the gate.

A further aspect of the present disclosure is a method including: forming a DNWELL region in a portion of a p-sub; forming a PWHV region in a portion of the DNWELL region; forming an NW laterally separated from the PWHV region in a portion of the DNWELL region; forming a LVPW region in a portion of the PWHV region; forming a first and a second P+ implant laterally separated in a portion of the LVPW region and a first N+ implant between the first and second P+ implants; forming a second N+ implant in a portion of the NW; forming a first STI structure through a portion of the LVPW region between and adjacent to the first P+ implant and the first N+ implant and a second STI through a portion of the N+ implant, NW, and DNWELL region; and forming a gate over the PWHV region having an edge aligned with an edge of the second P+ implant and the edge of the gate being over an edge of the LVPW region. Aspects of the present disclosure include a distance between the edge of the second P+ implant and the edge of the LVPW region being 0.3 μm to 1.5 μm.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of known ESD protection solutions exhibiting low $V_H$ and, therefore, not being latch-up safe, and compromising device area to efficiently control/scale $V_{t1}$ and $V_H$ attendant upon forming a HV ESD protection device. The problems are solved, inter alia, by adding a self-aligned P+ implant and a LVPW region at the source side of a LDMOS.

Methodology in accordance with embodiments of the present disclosure includes forming a DNWELL region in a portion of a p-sub. A PWHV region is formed in a portion of the DNWELL region. An NW laterally separated from the PWHV region is formed in a portion of the DNWELL region. A LVPW region is formed in a portion of the PWHV region. A first and a second STI structure are formed through a portion of the LVPW region and through a portion of the DNWELL region and NW, respectively. A gate is formed over the PWHV and DNWELL regions and a first and a second P+ implant laterally separated are formed in a portion of the LVPW region, an edge of the second P+ implant aligned with an edge of the gate. A first N+ implant is formed in the LVPW region between and adjacent to the first STI structure and the second P+ implant and a second N+ in the NW adjacent to the second STI structure. A first and a second contact are formed over the first and second P+ and N+ implants, respectively, and an electrical contact is formed over the second N+ implant.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
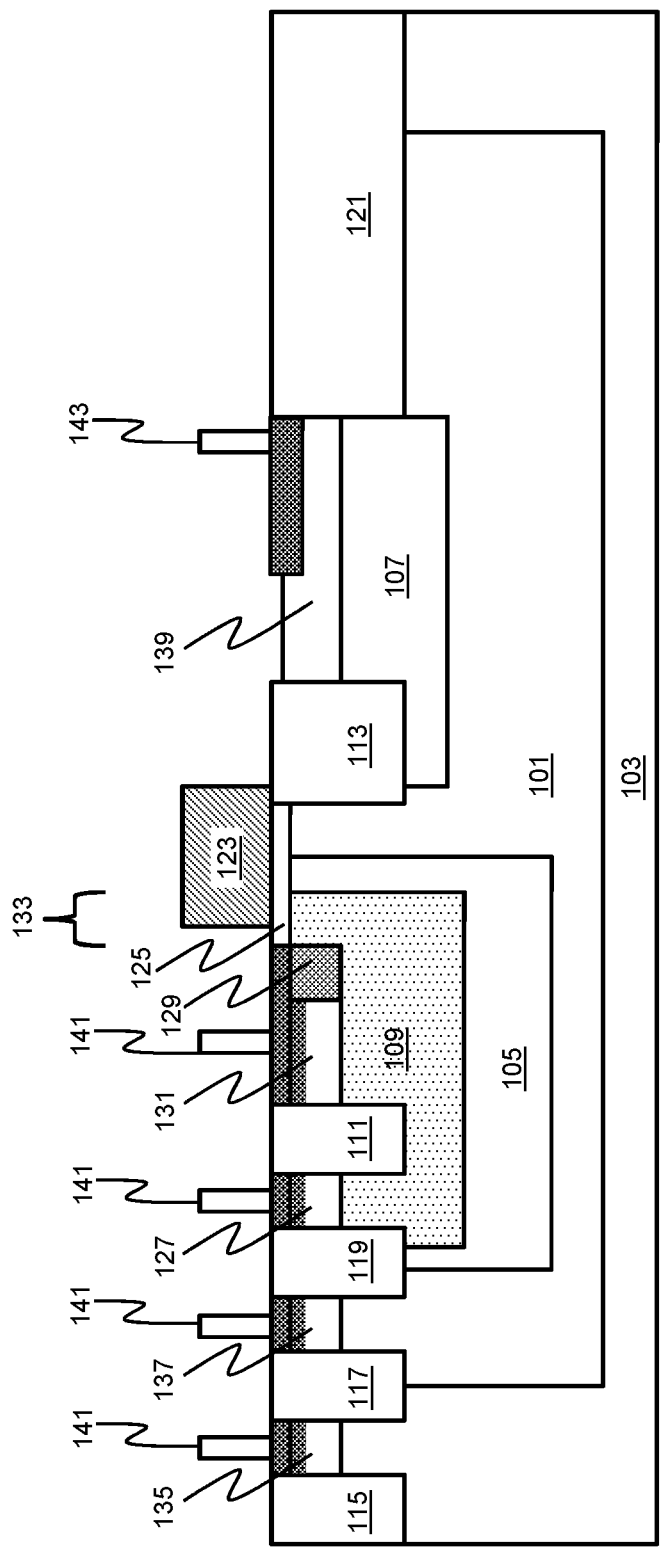
FIG. 1 schematically illustrates a cross-sectional view of a LDMOS transistor with an additional self-aligned P+ implant and a LVPW region at the source side of the device, in accordance with an exemplary embodiment.

FIG. 1 schematically illustrates a cross-sectional view of a LDMOS transistor with an additional self-aligned P+ implant and a LVPW region at the source side of the device, in accordance with an exemplary embodiment. Referring to FIG. 1, a DNWELL region 101 is formed in a portion of a p-sub 103. A PWHV region 105 is formed in a portion of the DNWELL region 101 on the source side of the device. A NW 107 laterally separated from the PWHV region 105 is formed in a portion of the DNWELL region 101. A LVPW region 109 is formed, e.g., by a boron ion implantation at a dosage, e.g., of 1 e17 per centimeter cubed (cm$^3$) to 1 e19 cm$^3$, in a portion of the PWHV region 105. STI structures 111 and 113 are formed laterally separated through a portion of the LVPW region 109 and through a portion of the DNWELL region 101 and NW 107, respectively. STI structures 115, 117, 119, and 121 are likewise formed through a portion of the p-sub 103; the p-sub 103 and DNWELL region 101; the DNWELL region 101, PWHV region 105, and LVPW region 109; and the p-sub 103 and the DNWELL region 101, respectively.

A gate 123 is formed, e.g., of polysilicon, over a gate dielectric layer 125 formed over respective portions of the PWHV and DNWELL regions 105 and 101, respectively. P+ implants 127 and 129 and an N+ implant 131 are formed in a portion of the LVPW region 109. In particular, the edge of the silicided P+ implant 129 is self-aligned with the edge of the gate 123. The doping concentration used to form the P+ implant 129 is greater than the doping concentration used to form the LVPW region 109, which is greater than the doping concentration used to form the PWHV region 105. Further, the LVPW region 109 is formed with an edge extending, e.g., 0.3 μm to 1.5 μm (distance 133), past the edge of the P+ implant 129 and under a portion of the gate 123. It should be noted; however, that the distance 133 also depends on the length of the gate 123 and for smaller gate lengths, the distance 133 should be closer to the lower limit of 0.3 μm and away from the upper limit of 1.5 µm. It should also be noted that the range of distance 133 is provided for illustration based on experimentation and is not intended as a limitation. A P+ implant 135 and an N+ implant 137 are formed in a portion of the p-sub 103 and DNWELL region 101, respectively, and an N+ implant 139 is formed above the NW 107. In addition contacts 141 are formed over the P+ implant 135, N+ implant 137, P+ implant 127, and N+ and P+ implants 131 and 129, respectively. Further, an electrical contact 143 is formed over the N+ implant 139.

Figure 2:
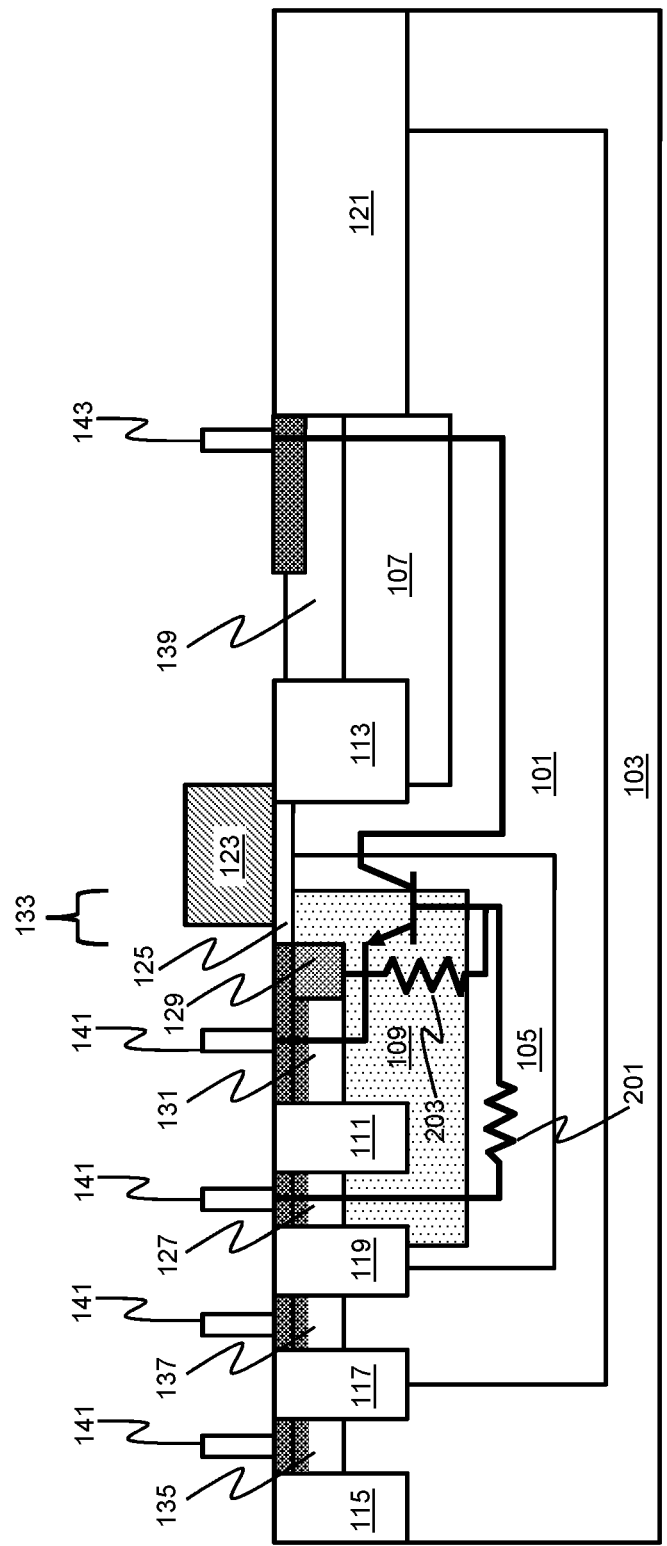
FIG. 2 schematically illustrates the principle underlying the ESD operation of the LDMOS transistor of FIG. 1.

FIG. 2 schematically illustrates the principle underlying the ESD operation of the LDMOS transistor of FIG. 1. Referring to FIG. 2, the bulk resistance ($R_B$) of the device is reduced as a result of the higher concentration ($R_{B1}$) (line 201) of the LVPW region 109 and the presence of the P+ stripe 129 ($R_{B2}$) (line 203). In addition, for a constant base current ($I_B$) (generated by avalanche of Drain-Body), the voltage that falls between the base and emitter of a bipolar junction transistor ($V_{BE}$) is reduced along with the beta of the NPN transistor ($\beta_{NPN}$). In particular, $\beta_{NPN}$ is reduced due to a higher recombination of minority carriers in the base. Consequently, the $V_H$ of the device of FIG. 1 is increased.

Figure 3:
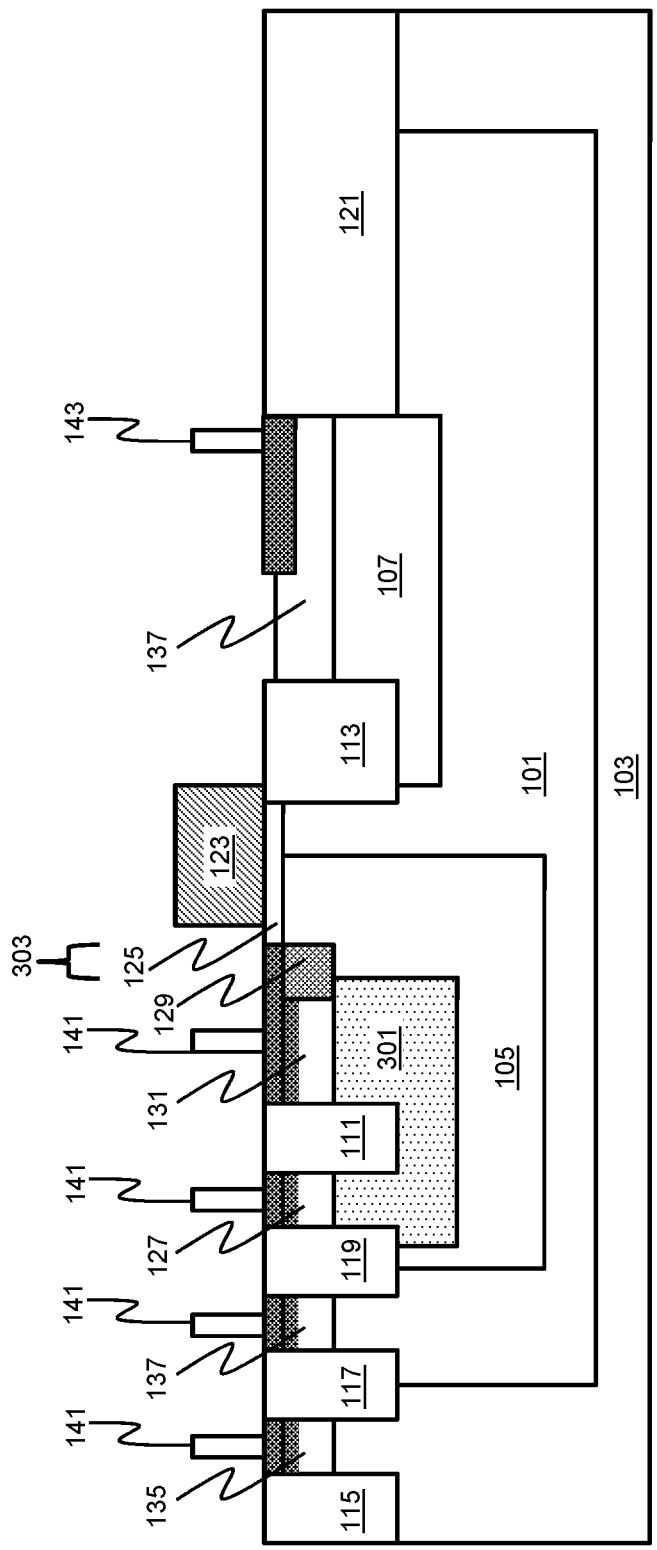
FIG. 3 schematically illustrates a cross-sectional view of a LDMOS with an additional self-aligned P+ implant and a "pulled-back" LVPW region at the source side of the device, in accordance with an exemplary embodiment.

FIG. 3 schematically illustrates a cross-sectional view of a LDMOS with an additional self-aligned P+ implant and a "pulled-back" LVPW region at the source side of the device, in accordance with an exemplary embodiment. The device of FIG. 3 is nearly identical to the device of FIG. 1, except in this instance, a LVPW region 301 is formed with an edge terminating, e.g., 0.1 µm to 0.3 µm (distance 303), away from an edge of the P+ implant 129 closest to the gate 123, i.e., the LVPW region 301 underlaps the P+ implant 129. In contrast, an edge of the LVPW region 109 of FIG. 1 extends past the edge of the P+ implant 129 and under a portion of the gate 123. Again, it should be noted that the range of distance 303 is provided for illustration based on experimentation and is not intended as a limitation.

The embodiments of the present disclosure can achieve several technical effects including improved $V_H$ and efficient control of $V_{t1}$ and $V_H$ without compromising the device area or requiring additional masks. In addition, reverse protection capability (body-drain diode) is maintained along with tight dispersion (stable without process). Further, as compared to known processes, e.g., gate length ($L_G$) up-scaling and adding more body contacts, similar or greater current density/area is obtained. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of highly integrated semiconductor devices including HHHV FETs.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming an n-doped well (DNWELL) region in a portion of a p-type substrate (p-sub);
   forming a high voltage p-well (PWHV) region in a portion of the DNWELL region;
   forming an n-well (NW) laterally separated from the PWHV region in a portion of the DNWELL region;
   forming a low-voltage p-well (LVPW) region in a portion of the PWHV region;
   forming a first and a second shallow trench isolation (STI) structure through a portion of the LVPW region and through a portion of the DNWELL region and NW, respectively;
   forming a gate over the p-sub;
   forming a first and a second p-type (P+) implant laterally separated in a portion of the LVPW region, an edge of the second P+ implant aligned with an edge of the gate;
   forming a first n-type (N+) implant in the LVPW region between and adjacent to the first STI structure and the second P+ implant and a second N+ implant in the NW adjacent to the second STI structure; and
   forming a first and a second contact over the first and second P+ and N+ implants, respectively, and an electrical contact over the second N+ implant,
      wherein the LVPW region is formed with an edge extended a distance past an edge of the second P+ implant and under a portion of the gate.

2. The method according to claim 1, wherein the distance comprises 0.3 micrometer (µm) to 1.5 µm.

3. The method according to claim 1, further comprising:
   forming a contact over each of the first and second N+ and P+ implants, respectively; and
   forming an electrical contact over the second N+ implant.

4. The method according to claim 1, further comprising:
   forming first, second, and third STI structures laterally separated through a portion of the p-sub, the p-sub and DNWELL region, and the DNWELL, PWHV, and LVPW regions, respectively, wherein an edge of the third STI structure is adjacent to the first P+ implant;
   forming a P+ implant in a portion of the p-sub between and adjacent to the first and second STI structures;
   forming an N+ implant in a portion of the DNWELL region between and adjacent to the second and third STI structures; and
   forming a fourth STI structure through a portion of the p-sub and DNWELL region and adjacent to the NW and second N+ implant.

5. The method according to claim 4, comprising forming a contact over each of the P+ and N+ implants.

6. The method according to claim 1, further comprising forming a gate dielectric layer over respective portions of the PWHV and DWELL regions prior to the forming of the gate.

7. A method comprising:
   forming an n-doped well (DNWELL) region in a portion of a p-type substrate (p-sub);
   forming a high voltage p-well (PWHV) region in a portion of the DNWELL region;
   forming an n-well (NW) laterally separated from the PWHV region in a portion of the DNWELL region;
   forming a low-voltage p-well (LVPW) region in a portion of the PWHV region;
   forming a first and a second shallow trench isolation (STI) structure through a portion of the LVPW region and through a portion of the DNWELL region and NW, respectively;

forming a gate over the p-sub;
forming a first and a second p-type (P+) implant laterally separated in a portion of the LVPW region, an edge of the second P+ implant aligned with an edge of the gate;
forming a first n-type (N+) implant in the LVPW region between and adjacent to the first STI structure and the second P+ implant and a second N+ implant in the NW adjacent to the second STI structure; and
forming a first and a second contact over the first and second P+ and N+ implants, respectively, and an electrical contact over the second N+ implant,
wherein the LVPW region is formed with an edge terminated a distance before an edge of the second P+ implant closest to the gate.

8. The method according to claim 7, wherein the distance comprises 0.1 μm to 0.3 μm.

9. A method comprising:
forming an n-doped well (DNWELL) region in a portion of a p-type substrate (p-sub);
forming a high voltage p-well (PWHV) region in a portion of the DNWELL region;
forming an n-well (NW) laterally separated from the PWHV region in a portion of the DNWELL region;
forming a low-voltage p-well (LVPW) region in a portion of the PWHV region;
forming a first and a second p-type (P+) implant laterally separated in a portion of the LVPW region and a first n-type (N+) implant between the first and second P+ implants;
forming a second N+ implant in a portion of the NW;
forming a first shallow trench isolation (STI) structure through a portion of the LVPW region between and adjacent to the first P+ implant and the first N+ implant and a second STI through a portion of the second N+ implant, NW, and DNWELL region; and
forming a gate over the PWHV region having an edge aligned with an edge of the second P+ implant and the edge of the gate being over an edge of the LVPW region.

10. The method according to claim 9, wherein a distance between the edge of the second P+ implant and the edge of the LVPW region comprises 0.3 micrometer μm) to 1.5 μm.

* * * * *